United States Patent
Ma et al.

(10) Patent No.: US 11,763,972 B2
(45) Date of Patent: Sep. 19, 2023

(54) MAGNETIC TUNNEL JUNCTION ELEMENT WITH A ROBUST REFERENCE LAYER

(71) Applicant: HeFeChip Corporation Limited, Sai Ying Pun (HK)

(72) Inventors: Qinli Ma, Mt Kisco, NY (US); Youngsuk Choi, Niskayuna, NY (US); Shu-Jen Han, Armonk, NY (US)

(73) Assignee: HeFeChip Corporation Limited, Sai Ying Pun (HK)

( * ) Notice: Subject to any disclaimer, the term of this patent is extended or adjusted under 35 U.S.C. 154(b) by 245 days.

(21) Appl. No.: 17/149,750

(22) Filed: Jan. 15, 2021

(65) Prior Publication Data

US 2021/0134504 A1 May 6, 2021

Related U.S. Application Data

(63) Continuation-in-part of application No. 16/529,752, filed on Aug. 1, 2019, now abandoned.

(60) Provisional application No. 62/717,907, filed on Aug. 12, 2018.

(51) Int. Cl.

| H01F 10/32 | (2006.01) |
|---|---|
| G11C 11/16 | (2006.01) |
| G01R 33/09 | (2006.01) |
| H10B 61/00 | (2023.01) |
| H10N 50/10 | (2023.01) |
| H10N 50/80 | (2023.01) |
| H10N 50/85 | (2023.01) |

(52) U.S. Cl.
CPC ....... *H01F 10/3272* (2013.01); *G01R 33/093* (2013.01); *G01R 33/098* (2013.01); *G11C 11/161* (2013.01); *H01F 10/3254* (2013.01); *H01F 10/3286* (2013.01); *H10B 61/00* (2023.02); *H10N 50/10* (2023.02); *H10N 50/80* (2023.02); *H10N 50/85* (2023.02)

(58) Field of Classification Search
CPC ....... H01L 43/02; H01L 43/10; H01L 27/228; G11C 11/161; H01F 10/3254; H01F 10/3268; H01F 10/3286; H01F 10/329
See application file for complete search history.

(56) References Cited

U.S. PATENT DOCUMENTS

| 8,981,503 | B2 | 3/2015 | Beach | |
|---|---|---|---|---|
| 9,773,972 | B1* | 9/2017 | Kim | .......... H01L 43/08 |
| 2003/0011944 | A1* | 1/2003 | Hosomi | ............... G01R 33/093 365/158 |
| 2009/0068567 | A1* | 3/2009 | Konishiike | ........... H01M 4/661 429/231.95 |
| 2009/0075808 | A1* | 3/2009 | Morikawa | ............... C04B 35/66 501/95.1 |
| 2010/0069618 | A1* | 3/2010 | Revel | ................ C07F 9/657181 568/8 |

(Continued)

*Primary Examiner* — Feifei Yeung Lopez
(74) *Attorney, Agent, or Firm* — Winston Hsu

(57) ABSTRACT

A magnetic tunnel junction (MTJ) element including a free layer, a reference layer; and a tunnel barrier layer between the free layer and the reference layer. The reference layer includes a first pinned layer, a second pinned layer, an anti-ferromagnetic coupling (AFC) spacer layer between the first pinned layer and the second pinned layer, a first spacer layer adjacent to the second pinned layer, a second spacer layer, a ferromagnetic layer sandwiched by the first spacer layer and the second spacer layer, a polarization enhancement layer adjacent to the second spacer layer.

16 Claims, 4 Drawing Sheets

(56) References Cited

U.S. PATENT DOCUMENTS

| | | | |
|---|---|---|---|
| 2012/0012953 A1* | 1/2012 | Lottis | H01L 43/08 |
| | | | 257/E29.323 |
| 2014/0027869 A1 | 1/2014 | Lee | |
| 2015/0295164 A1 | 10/2015 | Sandhu | |
| 2015/0311252 A1 | 10/2015 | Gan | |
| 2017/0141156 A1 | 5/2017 | Apalkov | |

* cited by examiner

MAGNETIC TUNNEL JUNCTION ELEMENT WITH A ROBUST REFERENCE LAYER

CROSS REFERENCE TO RELATED APPLICATIONS

This application is a continuation-in-part of U.S. application Ser. No. 16/529,752 filed on Aug. 1, 2019, which claims the benefit from U.S. provisional application No. 62/717,907, filed Aug. 12, 2018, the subject matter of which is hereby incorporated by reference.

BACKGROUND OF THE INVENTION

1. Field of the Invention

The invention relates to a magnetic memory device, and more particularly, to a robust reference layer of a magnetic tunnel junction (MTJ) element in a magnetic memory device.

2. Description of the Prior Art

Magnetoresistive random access memory (MRAM), based on the integration of silicon CMOS with MTJ technology, is a major emerging technology that is highly competitive with existing semiconductor memories such as SRAM, DRAM, Flash, etc. A MRAM device is generally comprised of an array of parallel first conductive lines such as word lines on a horizontal plane, an array of parallel second conductive lines such as bit lines on a second horizontal plane spaced above and formed in a direction perpendicular to the first conductive lines, and a MTJ element interposed between a first conductive line and a second conductive line at each crossover location. Typically, access transistors may be disposed below the array of first conductive lines to select certain MRAM cells within the MRAM array for read or write operations.

A MTJ element may be based on a tunnel magnetoresistance (TMR) effect wherein a stack of layers has a configuration in which two ferromagnetic layers are separated by a thin non-magnetic dielectric layer or tunnel barrier layer. If the tunnel barrier layer is thin enough, electrons can tunnel from one ferromagnet into the other. In a MRAM device, the MTJ element is typically formed between a bottom electrode and a top electrode. A MTJ stack of layers that is subsequently patterned to form a MTJ element may be formed by sequentially depositing a seed layer, an anti-ferromagnetic (AFM) pinning layer, a ferromagnetic "pinned" layer, a thin tunnel barrier layer, a ferromagnetic "free" layer, and a capping layer. The AFM layer holds the magnetic moment of the pinned layer in a fixed direction.

It is known that synthetic antiferromagnetic structure such as an antiferromagnetic coupling (AFC) layer has been introduced to balance the stray field from the reference layer on the free layer. However, the interference of fcc-111 of the AFC layer and bcc-001 of the tunnel barrier layer cause low MR (magneto resistance) ratio and weak anti-ferromagnetic coupling. An amorphous texture block layer may be introduced to break the interference of the AFC layer and the tunnel barrier layer and a ferromagnetic layer with high spin-polarization such as a polarization enhancement layer (PEL) may be introduced to improve TMR. However, the thickness of the PEL is limited by perpendicular magnetic anisotropy (PMA) and exchange field ($H_{ex}$) issue. It has been observed that thick PEL layer causes PMA loss of PEL and $H_{ex}$ decrease.

SUMMARY OF THE INVENTION

It is one object to provide an improved magnetic tunnel junction (MTJ) element in a magnetic memory device with a robust reference layer, which is capable of solving the above-mentioned prior art shortcomings or problems.

One aspect of the present disclosure provides a magnetic tunnel junction (MTJ) element including a free layer, a reference layer; and a tunnel barrier layer between the free layer and the reference layer. The reference layer includes a first pinned layer, a second pinned layer, an anti-ferromagnetic coupling (AFC) spacer layer between the first pinned layer and the second pinned layer, a first spacer layer on the second pinned layer, a ferromagnetic layer on the first spacer layer, and a second spacer layer on the ferromagnetic layer. The first spacer layer is in direct contact with the second pinned layer. The ferromagnetic layer is in direct contact with the second spacer layer. The first spacer layer and the second spacer layer have discontinuous and amorphous texture. The first spacer layer and the second spacer layer have same thickness and are composed of same material.

According to some embodiments, the free layer is made of at least one of the following materials: CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof.

According to some embodiments, the tunnel barrier layer is made of at least one of the following materials: MgO, $AlO_x$, MgAlO, MgZnO, HfO, or any combination thereof.

According to some embodiments, the first pinned layer and second pinned layer are made of at least one of the following materials: $[Co/Pt]_n$, $[Co/Pd]_n$, $[Co/Ni]_n$, CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof.

According to some embodiments, the AFC spacer layer comprises Ru, Ir, Rh, or Cr.

According to some embodiments, the polarization enhancement layer is in direct contact with the second spacer layer and the tunnel barrier layer.

According to some embodiments, the polarization enhancement layer comprises CoFeB, CoFeAl, or CoMnSi.

According to some embodiments, the first spacer layer and the second spacer layer comprise Ta, Mo, W, Ir, Rh, Zr, Nb, Hf, Cr, V, Bi, or any combination thereof.

According to some embodiments, the first spacer layer and the second spacer layer have a thickness of about 1-10 angstroms.

According to some embodiments, the ferromagnetic layer comprises Co, Fe, CoFeB, CoFeAl, CoMnSi, or any combination thereof.

According to some embodiments, the ferromagnetic layer has a thickness of about 4 angstroms to 15 angstroms.

Another aspect of the present disclosure provides a magnetoresistive random access memory (MRAM) device including a bottom electrode, a top electrode, and a magnetic tunnel junction (MTJ) element between the bottom electrode and the top electrode. The MTJ element includes a free layer, a reference layer, and a tunnel barrier layer between the free layer and the reference layer. The reference layer includes a first pinned layer, a second pinned layer, an anti-ferromagnetic coupling (AFC) spacer layer between the first pinned layer and the second pinned layer, a first spacer layer on the second pinned layer, a ferromagnetic layer on the first spacer layer, and a second spacer layer on the ferromagnetic layer. The first spacer layer is in direct contact with the second pinned layer. The ferromagnetic layer is in direct contact with the second spacer layer. The first spacer layer and the second spacer layer have discontinuous and amorphous texture. The first spacer layer and the second spacer layer have same thickness and are composed of same material.

According to some embodiments, the first spacer layer and the second spacer layer comprise Ta, Mo, W, Ir, Rh, Zr, Nb, Hf, Cr, V, Bi, or any combination thereof.

According to some embodiments, the first spacer layer and the second spacer layer have a thickness of about 1-10 angstroms.

According to some embodiments, the ferromagnetic layer comprises Co, Fe, CoFeB, CoFeAl, CoMnSi, or any combination thereof.

According to some embodiments, the ferromagnetic layer has a thickness of about 4 angstroms to 15 angstroms.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
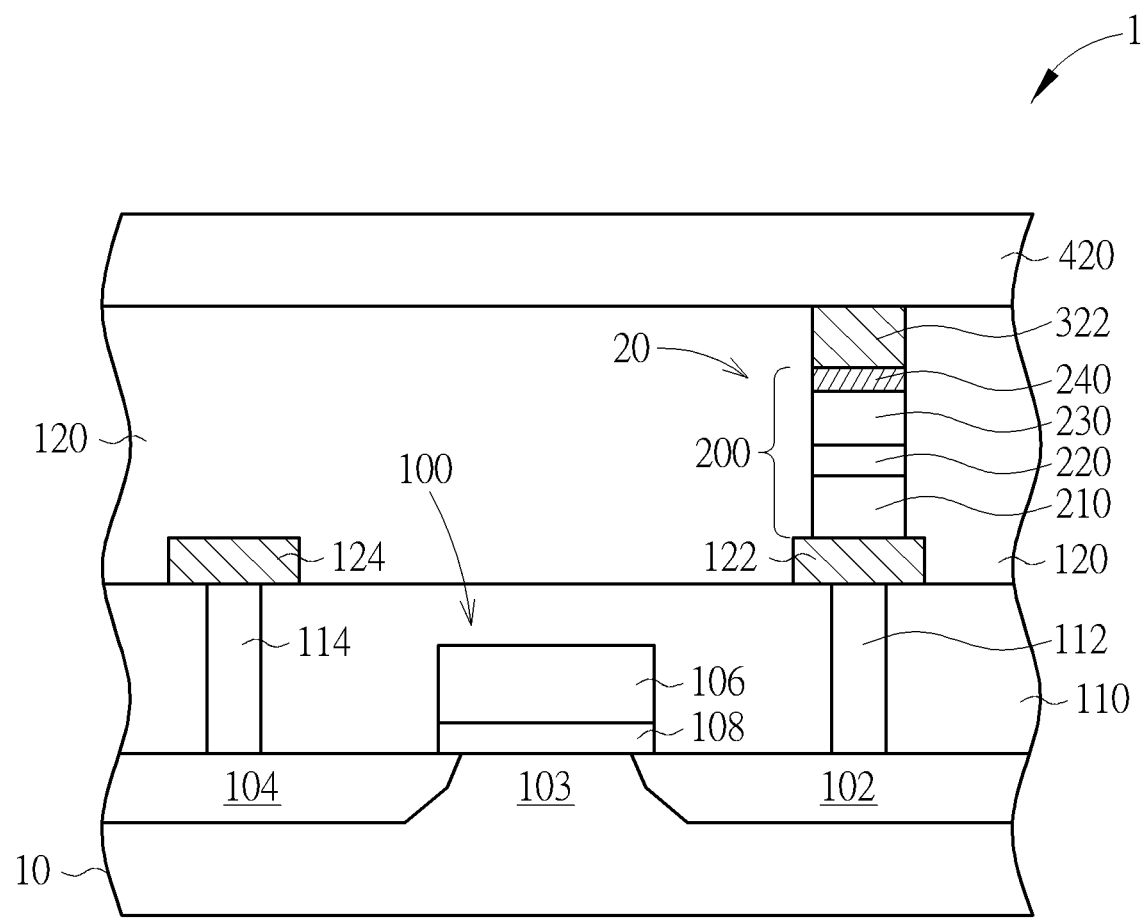
FIG. 1 is a schematic, cross-sectional diagram showing an exemplary 1T1MTJ structure of a MRAM device according to a non-limiting embodiment of the present invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The present disclosure pertains to an improved magnetic tunneling junction (MTJ) element of a magnetoresistive random access memory (MRAM) device such as a spin-transfer torque magnetoresistive random access memory (STT-MRAM) device. STT-MRAM is a non-volatile memory, which has several advantages over the conventional magnetoresistive random access memory. For example, these advantages include higher scalability, lower-power consumption, and faster operating speed. Spin transfer torque is an effect in which the magnetization orientation of a magnetic layer in a magnetic tunnel junction or spin valve can be modified using a spin-polarized current. STT-MRAM uses electrons that become spin-polarized as the electrons pass through a thin film (spin filter). During a write operation, the spin-polarized electrons exert torque on a free layer, which switches a polarity of the free layer. During a read operation, a current detects the resistance/logic state of the MTJ storage element.

The present disclosure is characterized in that the MTJ element comprises a robust reference layer. The robust reference layer has widely tunable net magnetization and enhanced perpendicular magnetic anisotropy, which is suited for applications of MRAM devices. In this disclosure, the robust reference layer may have the configuration of PL1/AFC-spacer/PL2/CE-spacer/CE-FM/MS/PEL, wherein PL1 and PL2 are pinned ferromagnetic layers having strong perpendicular magnetic anisotropy. AFC-spacer is sandwiched by PL1 and PL2 and has a well-defined thickness such that PL1 anti-ferromagnetically couples with PL2. A coupling enhancement (CE) structure is introduced, which includes a spacer (CE-spacer) and a ferromagnetic layer (CE-FM). The CE structure is disposed atop PL2, wherein CE-spacer is in direct contact with PL2. On top of the CE structure, an amorphous metal spacer (MS) and a ferromagnetic layer having high spin-polarization such as a polarization enhancement layer (PEL) are provided. The PEL is in direct contact with a tunnel barrier layer.

Materials used to form MTJ stacks of a MRAM device generally exhibit high tunneling magneto resistance (TMR) ratio, high perpendicular magnetic anisotropy (PMA) and good data retention. MTJ structures may be made in a perpendicular orientation, referred to as perpendicular magnetic tunnel junction (pMTJ) devices. A stack of materials (e.g., cobalt-iron-boron (CoFeB) materials) with a dielectric barrier layer (e.g., magnesium oxide (MgO)) may be used in a pMTJ structure. For example, a pMTJ structure including a stack of materials (e.g., CoFeB/MgO/CoFeB) may be considered for use in MRAM structures.

FIG. 1 is a schematic, cross-sectional diagram showing an exemplary one-transistor-one-MTJ (1T1MTJ) structure of a MRAM device 1 according to a non-limiting embodiment of the present invention. As shown in FIG. 1, the MRAM device 1 comprises a substrate 10 having a top surface 10a. For example, the substrate 10 may be a silicon substrate, a silicon-on-insulator (SOI) substrate, or any suitable semiconductor substrates known in the art. An access transistor 100 may be formed on the top surface 10a of the substrate 10. The access transistor 100 may comprise a drain doping region 102 and a source doping region 104 spaced apart from the drain doping region 104. The drain doping region 102 and the source doping region 104 may be formed by ion implantation process and may be formed in the substrate 10. A channel region 103 may be formed between the drain doping region 102 and the source doping region 104. A gate 106 may be formed over the channel region 103. A gate dielectric layer 108 such as a silicon oxide layer may be formed between the gate 106 and the channel region 103.

It is to be understood that the MRAM device 1 may comprise peripheral circuits for supporting the MRAM memory array. The peripheral circuits may be formed in a logic circuit area, which is not shown for the sake of simplicity.

An inter-layer dielectric (ILD) layer 110 such as an ultra-low k (ULK) dielectric layer may be deposited over the substrate 10. The ILD layer 110 covers the gate 106, the drain doping region 102, and the source doping region 104 of the transistor 100. A contact plug 112 and a contact plug 114 may be formed directly on the drain doping region 102 and the source doping region 104, respectively, in the ILD layer 110. For example, the contact plug 112 and the contact plug 114 may comprise Cu, Ti, TiN, Ta, TaN, W, alloys or combinations thereof, but is not limited thereto. An inter-layer dielectric (ILD) layer 120 may be deposited over the ILD layer 110.

According to one embodiment, a cylindrical memory stack 20 may be formed on the contact plug 112 in the ILD layer 120. The cylindrical memory stack 20 may comprise a MTJ element 200 sandwiched by a bottom electrode 122 and a top electrode 322. The MTJ element 200 is electrically coupled to the drain doping region 102 through the bottom electrode 122 and the contact plug 112. For example, the bottom electrode 122 may comprise NiCr, Ru, Cu, Ta, TaN, Ti, TiN, or any combination thereof.

According to one embodiment, the MTJ element 200 may further comprise a capping layer 240, such as MgO, interposed between the top electrode 322 and the free layer 230. According to one embodiment, the top electrode 322 may be made of ruthenium (Ru) having a hexagonal close packed (hcp) crystalline structure. The top electrode 322 also acts as an etching stopper, for example, during an ion beam etching process. The MTJ element 200 is electrically connected to an overlying bit line 420 through the top electrode 322.

According to one embodiment, the MTJ element 200 may comprise layered structure including, but not limited to, a reference layer (or pinned layer) 210, a tunnel barrier layer 220 stacked directly on the reference layer 210, and a free layer 230 stacked directly on the tunnel barrier layer 220.

According to one embodiment, the tunnel barrier layer 220 may comprise an insulator, including but not limited to MgO, $AlO_x$, MgAlO, MgZnO, HfO, or any combination thereof. According to one embodiment, the tunnel barrier layer 220 may have a thickness of about 0.5 nm-3.0 nm.

According to one embodiment, the free layer 230 may comprise ferromagnetic materials. For example, the free layer 230 may be a single layer or multi-layer structure. For example, the free layer 230 may comprise Fe, Co, B, Ni, or any combination thereof. For example, the free layer 230 may be formed of a magnetic material including but not limited to CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof.

Figure 2:
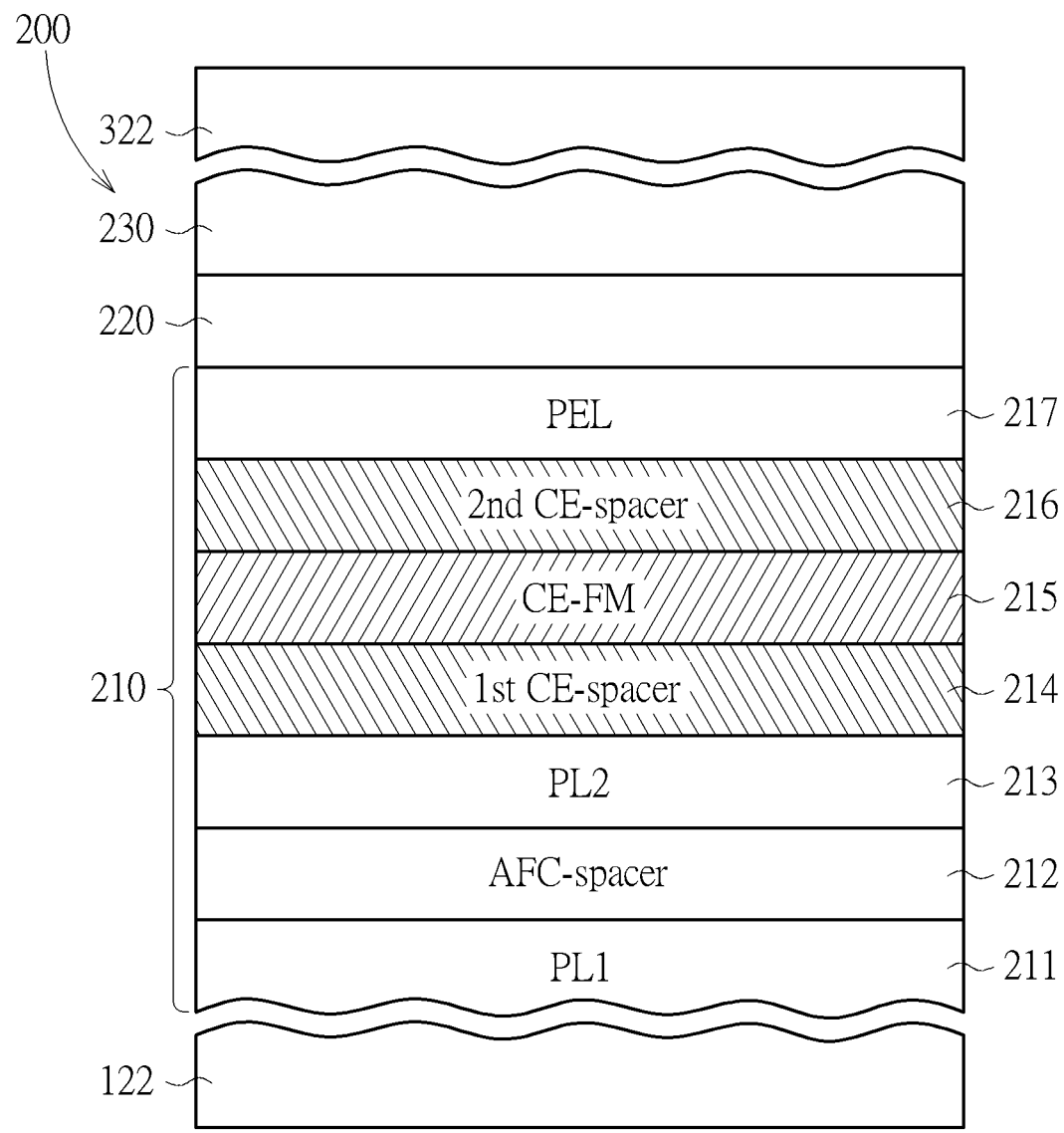
FIG. 2 is a schematic, cross-sectional diagram showing the MTJ element having the robust reference layer according to one embodiment of the invention.

FIG. 2 is a schematic, cross-sectional diagram showing the reference layer 210 of the MTJ element according to one embodiment of the invention. As shown in FIG. 2, the MTJ element 200 is disposed between the bottom electrode 122 and the top electrode 322. The reference layer 210 comprises a first pinned layer (PL1) 211 disposed on the bottom electrode 122, an AFC-spacer 212 on the first pinned layer (PL1) 211, a second pinned layer (PL2) 213 on the AFC-spacer 212, a coupling enhancement (CE) structure comprising a first spacer layer (hereinafter first CE-spacer) 214 on the second pinned layer (PL2) 213, a ferromagnetic layer (hereinafter CE-FM) 215 on the first CE-spacer 214, and a second spacer layer (hereinafter second CE-spacer) 216 on the CE-FM 215, and a polarization enhancement layer (PEL) 217 on the second CE-spacer 216. The polarization enhancement layer (PEL) 217 is in direct contact with the tunnel barrier layer 220.

According to one embodiment, the first pinned layer (PL1) 211 and second pinned layer (PL2) 213 are pinned ferromagnetic layers having strong perpendicular magnetic anisotropy. For example, the PL1 and PL2 may comprise multilayer structure or superlattice such as $[Co/Pt]_n$, $[Co/Pd]_n$, $[Co/Ni]_n$, in which n is a stacking number of each layer and is an integer greater than or equal to 2. For example, the PL1 and PL2 may comprise FePt, CoPt, FePd, TeFeCo, GdCo, MnGa, MnGe, MnSi, or any combination thereof. For example, the PL1 and PL2 may have a thickness of about 10 angstroms to 50 angstroms.

According to one embodiment, the AFC-spacer 212 may provide antiferromagnetic coupling between the first pinned layer (PL1) 211 and second pinned layer (PL2) 213. For example, the AFC-spacer 212 may comprise Ru, Ir, Rh, Cr, or the like. For example, the AFC-spacer 212 may have a thickness of about 2 angstroms to 15 angstroms.

Figure 4:
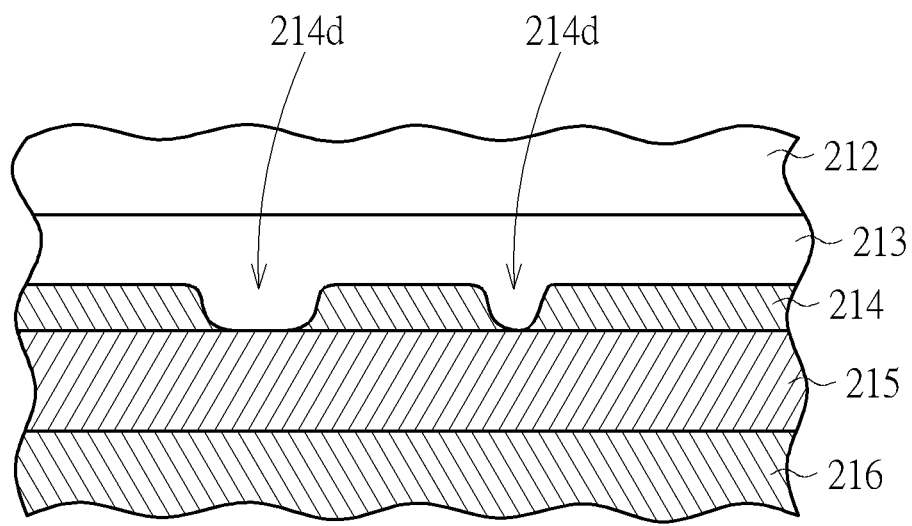
FIG. 4 is a partial, cross-sectional diagram of MTJ element showing the discontinuities of the first CE spacer according to another embodiment of the invention.

According to one embodiment, as shown in FIG. 4, the first CE spacer 214 may have discontinuous and amorphous texture and may provide PMA of CE-FM 215 at CE-spacer/CE-FM interface. The discontinuities 214d of the first CE spacer 214 may provide contact regions between the second pinned layer (PL2) 213 and the CE-FM 215. That is, the second pinned layer (PL2) 213 may be in direct contact with the CE-FM 215 at these discontinuities 214d. The first CE spacer 214 also provides strong exchange coupling between CE-FM 215 and second pinned layer (PL2) 213. For example, the first CE spacer 214 may comprise Ta, Mo, W, Ir, Rh, Zr, Nb, Hf, Cr, V, Bi, or any combination thereof. For example, the first CE spacer 214 may have a thickness of about 1-10 angstroms.

According to one embodiment, the CE-FM 215 may comprise ferromagnet. For example, the CE-FM 215 may comprise Co, Fe, CoFeB, CoFeAl, CoMnSi, or any combination thereof. For example, the CE-FM 215 may have a thickness of about 4 angstroms to 15 angstroms.

Figure 5:
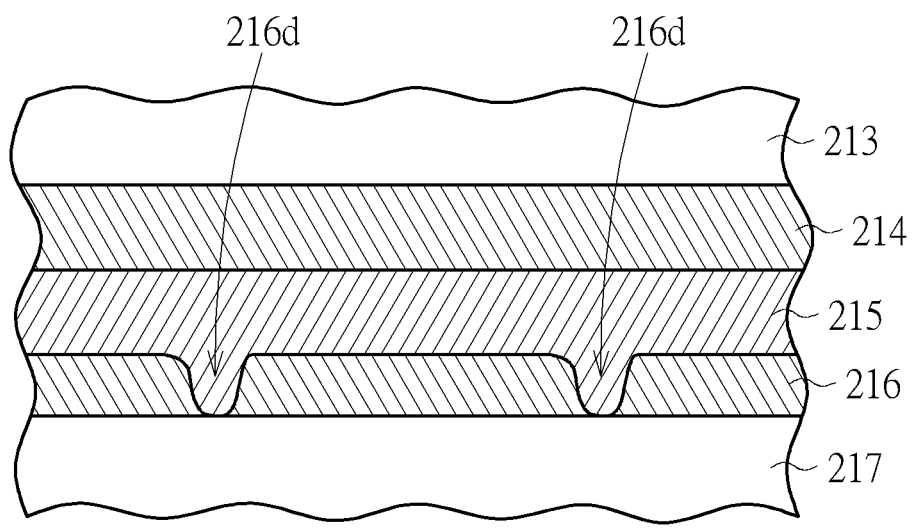
FIG. 5 is a partial, cross-sectional diagram of MTJ element showing the discontinuities of the second CE spacer according to still another embodiment of the invention.

According to one embodiment, as shown in FIG. 5, the second CE-spacer 216 may comprise metal having discontinuous and amorphous texture, which provides PMA of PEL 217 at PEL/tunnel barrier layer 220 interface. The discontinuities 216d of the second CE spacer 216 may provide contact regions between the CE-FM 215 and the polarization enhancement layer (PEL) 217. That is, the CE-FM 215 may be in direct contact with the polarization enhancement layer (PEL) 217 at these discontinuities 216d. For example, the second CE-spacer 216 may comprise Ta, Mo, W, Ir, Rh, Zr, Nb, Hf, Cr, V, Bi, or any combination thereof. For example, the second CE-spacer 216 may have a thickness of about 6-10 angstroms. According to one embodiment, the first CE-spacer 214 and the second CE-spacer 216 have substantially the same thickness and are made of the same material. According to one embodiment, for example, the first CE-spacer 214 and the second CE-spacer 216 both have a thickness of about 6-10 angstroms.

According to one embodiment, the polarization enhancement layer (PEL) 217 may comprise ferromagnet having high spin-polarization. The polarization enhancement layer (PEL) 217 may acquire PMA at the interface between the second CE-spacer 216 and the tunnel barrier layer 220. For example, the polarization enhancement layer (PEL) 217 may comprise a magnetic element including but not limited to Fe, Co, Ni, or Mn and a non-magnetic element including but not limited to B, Al, or Si. For example, the polarization enhancement layer (PEL) 217 may comprise CoFeB, CoFeAl, or CoMnSi. For example, the polarization enhancement layer (PEL) 217 may have a thickness of about 4 angstroms to 10 angstroms.

Figure 3:
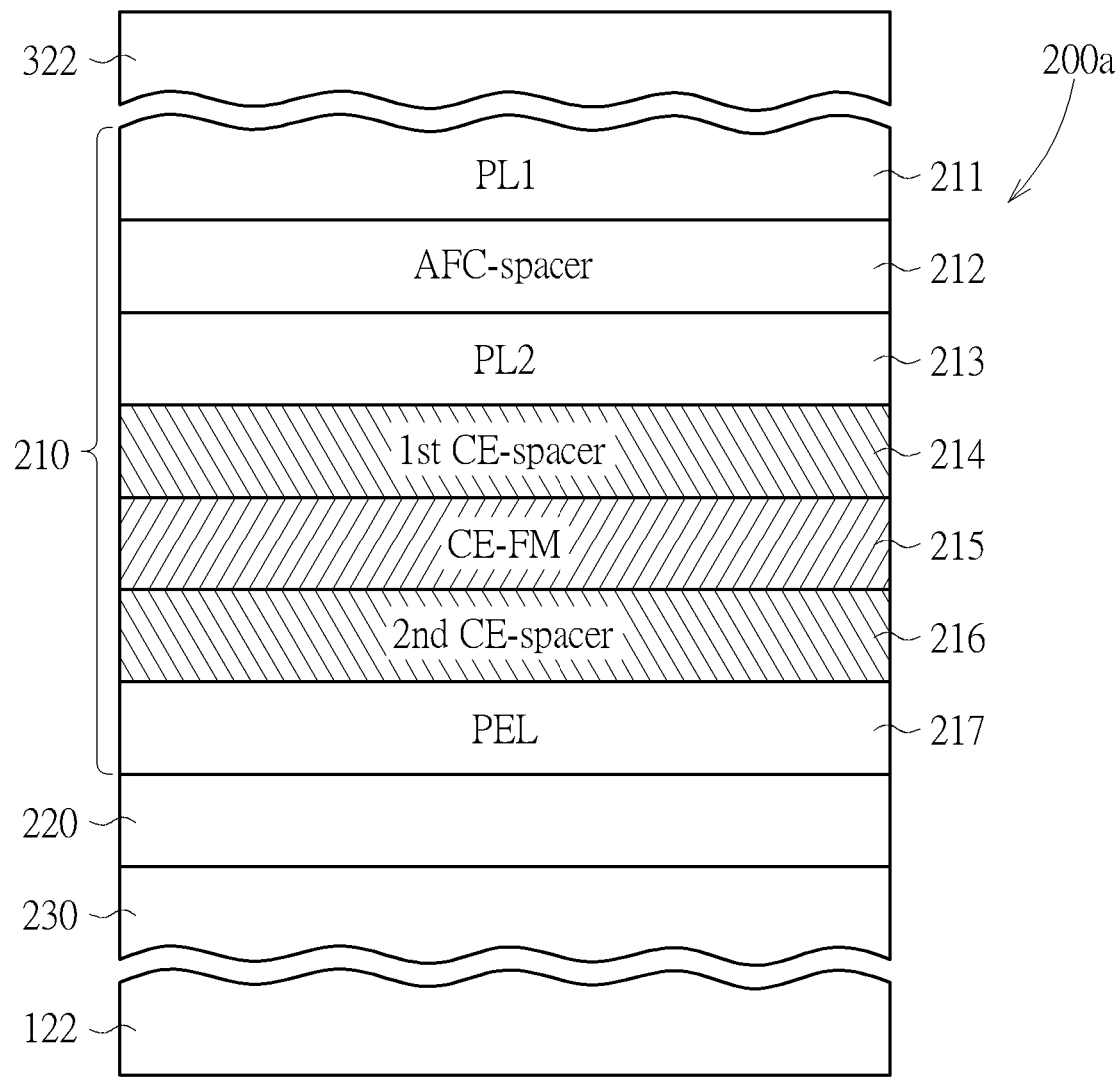
FIG. 3 is a schematic, cross-sectional diagram showing the MTJ element having the robust reference layer according to another embodiment of the invention.

FIG. 3 is a schematic, cross-sectional diagram showing the reference layer 210 of the MTJ element according to another embodiment of the invention. As shown in FIG. 3, the MTJ element 200a is disposed between the bottom electrode 122 and the top electrode 322. The MTJ element 200a may be referred to as a bottom MTJ because the location of the free layer 230 is proximity to the bottom electrode 122 and the substrate (not shown in this figure).

According to one embodiment, the reference layer 210 comprises, from top to bottom, a first pinned layer (PL1) 211, an AFC-spacer 212, a second pinned layer (PL2) 213, a coupling enhancement (CE) structure comprising a first CE-spacer 214 and a CE-FM 215, a second CE-spacer 216, and a polarization enhancement layer (PEL) 217. The polarization enhancement layer (PEL) 217 is in direct contact with the tunnel barrier layer 220.

According to one embodiment, the first pinned layer (PL1) 211 and second pinned layer (PL2) 213 are pinned ferromagnetic layers having strong perpendicular magnetic anisotropy. For example, the PL1 and PL2 may comprise multilayer or superlattice structure such as $[Co/Pt]_n$, $[Co/Pd]_n$, $[Co/Ni]_n$, in which n is a stacking number of each layer and is an integer greater than or equal to 2. For example, the PL1 and PL2 may comprise FePt, CoPt, FePd, TeFeCo, GdCo, MnGa, MnGe, MnSi, or any combination thereof. For example, the PL1 and PL2 may have a thickness of about 10 angstroms to 50 angstroms.

According to one embodiment, the AFC-spacer 212 may provide antiferromagnetic coupling between the first pinned layer (PL1) 211 and second pinned layer (PL2) 213. For example, the AFC-spacer 212 may comprise Ru, Ir, Rh, Cr, or the like. For example, the AFC-spacer 212 may have a thickness of about 2 angstroms to 15 angstroms.

According to one embodiment, the first CE spacer 214 may have discontinuous and amorphous texture and may provide PMA of CE-FM 215 at CE-spacer/CE-FM interface. The first CE spacer 214 also provides strong exchange coupling between CE-FM 215 and second pinned layer (PL2) 213. For example, the first CE spacer 214 may comprise Ta, Mo, W, Ir, Rh, Zr, Nb, Hf, Cr, V, Bi, or any combination thereof. For example, the first CE spacer 214 may have a thickness of about 1-10 angstroms.

According to one embodiment, the CE-FM 215 may comprise ferromagnet For example, the CE-FM 215 may comprise Co, Fe, CoFeB, CoFeAl, CoMnSi, or any combination thereof. For example, the CE-FM 215 may have a thickness of about 4 angstroms to 15 angstroms.

According to one embodiment, the second CE-spacer 216 may comprise metal having discontinuous and amorphous texture, which provides PMA of PEL 217 at PEL/tunnel barrier layer 220. For example, the second CE-spacer 216 may comprise Ta, Mo, W, Ir, Rh, Zr, Nb, Hf, Cr, V, Bi, or any combination thereof. For example, the second CE-spacer 216 may have a thickness of about 6-10 angstroms. According to one embodiment, the first CE-spacer 214 and the second CE-spacer 216 have substantially the same thickness and are made of the same material. According to one embodiment, for example, the first CE-spacer 214 and the second CE-spacer 216 both have a thickness of about 1-10 angstroms.

According to one embodiment, the polarization enhancement layer (PEL) 217 may comprise ferromagnet having high spin-polarization. The polarization enhancement layer (PEL) 217 may acquire PMA at the interface between the second CE-spacer 216 and the tunnel barrier layer 220. For example, the polarization enhancement layer (PEL) 217 may comprise a magnetic element including but not limited to Fe, Co, Ni, or Mn and a non-magnetic element including but not limited to B, Al, or Si. For example, the polarization enhancement layer (PEL) 217 may comprise CoFeB, CoFeAl, or CoMnSi. For example, the polarization enhancement layer (PEL) 217 may have a thickness of about 4 angstroms to 10 angstroms.

It is advantageous to use the present disclosure because the experimental results show that the MRAM device 1 having MTJ element 200 incorporated with the coupling enhancement (CE) structure comprising the first and second CE spacers 214, 216 sandwiching about and the CE-FM 215 can have smaller delta magnetic moment (ΔM) and significantly increased exchange field ($H_{ex}$) compared to the MTJ without CE structure, which are beneficial for performance of the MRAM devices. To support low write error rate (WER), a larger $H_{ex}$ is desirable. Smaller ΔM is beneficial for write_0/write_1 symmetry.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetic tunnel junction (MTJ) element, comprising:
a free layer;
a reference layer comprising a first pinned layer, a second pinned layer, an anti-ferromagnetic coupling (AFC) spacer layer between the first pinned layer and the second pinned layer, a first spacer layer on the second pinned layer, a ferromagnetic layer on the first spacer layer, and a second spacer layer on the ferromagnetic layer, wherein the first spacer layer is in direct contact with the second pinned layer, and the ferromagnetic layer is in direct contact with the second spacer layer, wherein the first spacer layer and the second spacer layer have discontinuous and amorphous structure, wherein the discontinuous and amorphous structure of the first spacer layer comprises discontinuities allowing direct contact between the second pinned layer and the ferromagnetic layer, and wherein the first spacer layer and the second spacer layer have same thickness and are composed of same material; and
a tunnel barrier layer between the free layer and the reference layer.

2. The MTJ element according to claim 1, wherein the free layer is made of at least one of the following materials: CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof.

3. The MTJ element according to claim 1, wherein the tunnel barrier layer is made of at least one of the following materials: MgO, AlO, MgAlO, MgZnO, HfO, or any combination thereof.

4. The MTJ element according to claim 1, wherein the first pinned layer and second pinned layer are made of at least one of the following materials: $[Co/Pt]_n$, $[Co/Pd]_n$, $[Co/Ni]_n$, CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof.

5. The MTJ element according to claim 1, wherein the AFC spacer layer comprises Ru, Ir, Rh, or Cr.

6. The MTJ element according to claim 1 further comprising a polarization enhancement layer, wherein the polarization enhancement layer is in direct contact with the second spacer layer and the tunnel barrier layer.

7. The MTJ element according to claim 6, wherein the polarization enhancement layer comprises CoFeB, CoFeAl, or CoMnSi.

8. The MTJ element according to claim 1, wherein the first spacer layer and the second spacer layer comprise Ta, Mo, W, Ir, Rh, Zr, Nb, Hf, Cr, V, Bi, or any combination thereof.

9. The MTJ element according to claim 1, wherein the first spacer layer and the second spacer layer have a thickness of about 1-10 angstroms.

10. The MTJ element according to claim 1, wherein the ferromagnetic layer comprises Co, Fe, CoFeB, CoFeAl, CoMnSi, or any combination thereof.

11. The MTJ element according to claim 10, wherein the ferromagnetic layer has a thickness of about 4 angstroms to 15 angstroms.

12. A magnetoresistive random access memory (MRAM) device, comprising:
a bottom electrode;
a top electrode; and
a magnetic tunnel junction (MTJ) element between the bottom electrode and the top electrode;
wherein the MTJ element comprises:
a free layer;
a reference layer comprising a first pinned layer, a second pinned layer, an anti-ferromagnetic coupling (AFC) spacer layer between the first pinned layer and the second pinned layer, a first spacer layer on the second pinned layer, a ferromagnetic layer on the first spacer layer, and a second spacer layer on the ferromagnetic layer, wherein the first spacer layer is in direct contact with the second pinned layer, and the ferromagnetic layer is in direct contact with the second spacer layer, wherein the first spacer layer and the second spacer layer have discontinuous and amorphous structure, wherein the discontinuous and amorphous structure of the first spacer layer comprises discontinuities allowing direct contact between the second pinned layer and the ferromagnetic layer, and wherein the first spacer layer and the second spacer layer have same thickness and are composed of same material; and
a tunnel barrier layer between the free layer and the reference layer.

13. The MRAM device according to claim 12, wherein the first spacer layer and the second spacer layer comprise Ta, Mo, W, Ir, Rh, Zr, Nb, Hf, Cr, V, Bi, or any combination thereof.

14. The MRAM device according to claim 13, wherein the first spacer layer and the second spacer layer have a thickness of about 1-10 angstroms.

15. The MRAM device according to claim 12, wherein the ferromagnetic layer comprises Co, Fe, CoFeB, CoFeAl, CoMnSi, or any combination thereof.

16. The MRAM device according to claim 15, wherein the ferromagnetic layer has a thickness of about 4 angstroms to 15 angstroms.

* * * * *